United States Patent
Huang et al.

(10) Patent No.: US 9,191,193 B1
(45) Date of Patent: Nov. 17, 2015

(54) CLOCK SYNCHRONIZATION

(71) Applicant: QUALCOMM Incorporated, San Diego, CA (US)

(72) Inventors: Xuhao Huang, San Diego, CA (US); Yi-Hung Tseng, San Diego, CA (US); Philip Michael Clovis, San Diego, CA (US); Sushma Chilukuri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/335,185

(22) Filed: Jul. 18, 2014

(51) Int. Cl.
*H03D 3/24* (2006.01)
*H04L 7/033* (2006.01)
*H03L 7/081* (2006.01)

(52) U.S. Cl.
CPC .............. *H04L 7/0331* (2013.01); *H03L 7/081* (2013.01)

(58) Field of Classification Search
CPC . H04L 7/0337; H04L 25/068; H04L 2207/50; H04L 7/06; H04L 7/0807

USPC .......... 375/376; 327/144, 147, 149, 150, 152, 327/153, 156, 158, 159

See application file for complete search history.

(56) References Cited

U.S. PATENT DOCUMENTS

| | | |
|---|---|---|
| 6,937,530 B2 | 8/2005 | Bell |
| 7,116,141 B2 | 10/2006 | Demone |
| 7,173,462 B1* | 2/2007 | Wang ............................ 327/158 |
| 7,295,048 B2 | 11/2007 | Gilliland |
| 7,835,205 B2 | 11/2010 | Kim et al. |
| 8,085,074 B1 | 12/2011 | Janardhanan et al. |
| 8,427,195 B1* | 4/2013 | Lee et al. ......................... 326/16 |
| 2004/0080349 A1* | 4/2004 | Kawahito et al. ............. 327/158 |
| 2007/0170967 A1* | 7/2007 | Bae et al. ....................... 327/233 |
| 2014/0118040 A1* | 5/2014 | Nakayama et al. ........... 327/157 |

* cited by examiner

*Primary Examiner* — Don N Vo
(74) *Attorney, Agent, or Firm* — Haynes and Boone, LLP

(57) ABSTRACT

A clock synchronization circuit includes a multi-phase clock generator to generate a plurality of delayed clocks, each delayed clock having a unique delay with regard to a source clock. The clock synchronization circuit further includes a selection circuit that selects one of the delayed clocks according to a phase error to form a local clock driven into a local clock path and received at the clock synchronization circuit as a received local clock. The selection circuit determines the phase error by comparing the received local clock to a reference clock.

21 Claims, 5 Drawing Sheets

CLOCK SYNCHRONIZATION

TECHNICAL FIELD

This application relates to synchronization of a clock signal with regard to another clock signal.

BACKGROUND

Modern ASICs such as a system-on-a-chip (SOC) integrate many functions into a single chip. To address the increased complexity in modern designs, the system clock is often split into several local clock domains. By splitting the system clock in this fashion, the loading on the global clock is reduced, which in turn reduces the insertion delay and clock jitter. The local circuits receiving the local clocks thus benefit from reduced uncertainty due to the reduced jitter and are more robust over process and temperature variations.

Although multiple clock domains are thus an attractive alternative as compared to using a single global clock, the local clocks must still be phase aligned with the global clock. A conventional technique to keep multiple clocks in phase alignment involves the use of phase-locked loops (PLLs). But the synchronization from a PLL is typically slow due to their low bandwidth. For example, the lock time for a conventional PLL to align one clock with another is on the order of tens or hundreds of micro seconds. In addition, each additional clock domain requires another PLL such that N clock domains require (N−1) PLLs. The use of such a multiplicity of PLLs as the number N of clock domains is increased requires excessive die area and leads to high power consumption.

Accordingly, there is a need in the art for improved clock synchronization techniques and circuits.

SUMMARY

A synchronization circuit is provided that includes a multi-phase generator for generating a multi-phase clock. The multi-phase clock comprises a series of delayed versions of a source clock. The synchronization circuit further includes a selector circuit that selects from the delayed versions according to a phase error to form a local clock that is driven into a clock path. The selector circuit receives the local clock after its propagation through the clock path as a received local clock and also receives a reference clock. The selector circuit compares the received local clock to a reference clock to generate the phase error.

These advantageous features may be better appreciated with reference to the following detailed description.

BRIEF DESCRIPTION OF THE DRAWINGS

Embodiments of the disclosed clock synchronization system and their advantages are best understood by referring to the detailed description that follows. It should be appreciated that like reference numerals are used to identify like elements illustrated in one or more of the figures.

DETAILED DESCRIPTION

To meet this need in the art for improved clock synchronization circuits and techniques, a clock synchronization circuit is provided that includes a multi-phase clock generator for generating a plurality of delayed clocks and further includes a selector circuit for selecting from the plurality of delayed clocks to form a local clock. The selector circuit makes the selection responsive to a phase error between a received version of the local clock and a reference clock. In this fashion, the selected delayed clock addresses the phase error such that the received local clock is phase aligned with the reference clock.

Figure 1:
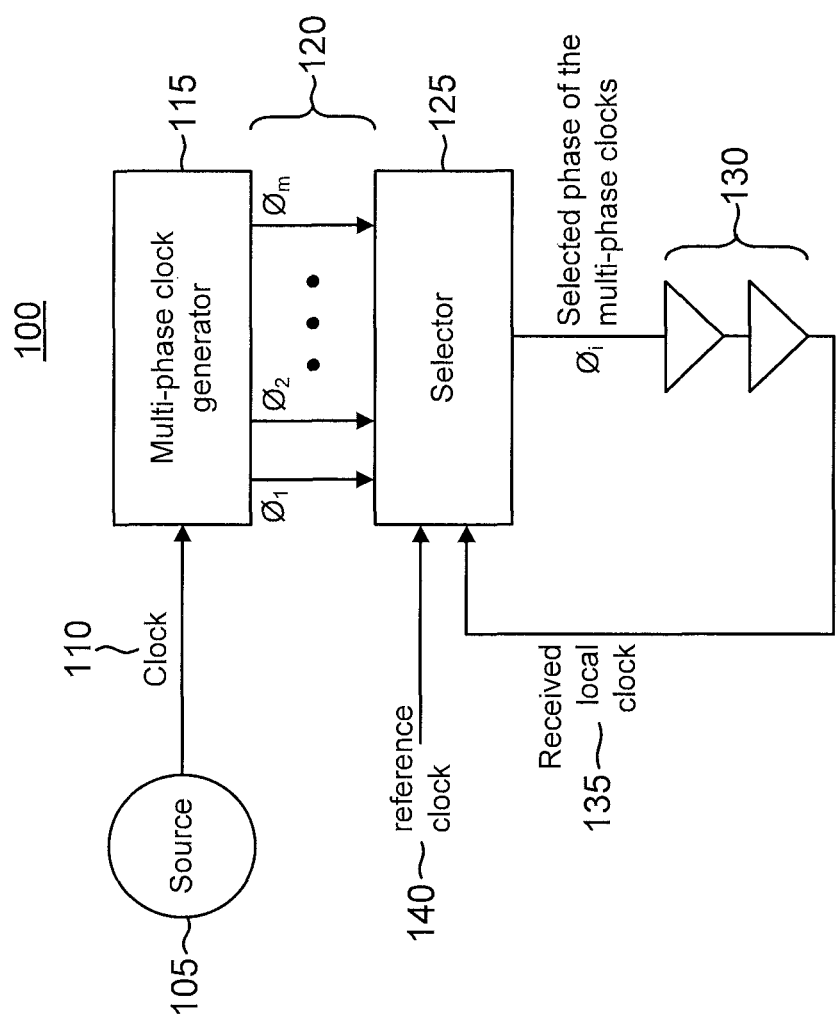
FIG. 1 is a block diagram of an example clock synchronization system.

An example clock synchronization circuit 100 is shown in FIG. 1. A clock source 105 such as a phase-locked loop (PLL) produces a source clock 110. A multi-phase clock generator 115 generates a multi-phase clock 120 based on source clock 110. In particular, multi-phase clock 120 comprises a plurality m of delayed clocks successively arranged from a first delayed clock $\phi_1$ that is phase shifted with regard to source clock 110 by a phase-shift $\phi$ to a final mth delayed clock $\phi_m$ that is phase shifted with regard to source clock 110 by m$\phi$, where m is a integer greater than one. Each successive delayed clock is phase shifted by $\phi$ with regard to the preceding delayed clock. For example, a second delayed clock $\phi_2$ is phase shifted by $\phi$ with to first delayed clock $\phi_1$. Similarly, a third delayed clock $\phi_3$ (not illustrated) is phase shifted by $\phi$ with regard to second delayed clock $\phi_2$. The mth delayed clock $\phi_m$ is thus phase shifted by $\phi$ with regard to an (m−1)th delayed clock $\phi_{m-1}$ (not illustrated).

The phase shift $\phi$ is equivalent to a delay A that depends on a clock cycle period T for source clock 110 and the number m of the delayed clocks. In particular, the delay $\Delta$ equals T/m. The equivalent phase shift $\phi$ equals $2\pi/m$. A selector circuit 125 selects from multi-phase clock 120 to output a selected delayed clock $\phi_i$, where i is an integer representing the selected delayed clock. For example, if selector circuit 125 selects first delayed clock $\phi_1$, then i equals one. Conversely, if selector circuit 125 selects second delayed clock $\phi_2$, then i equals two, and so on such that if selector circuit 125 selects mth delayed clock $\phi_m$, then i equals m. Selector circuit 125 drives out the selected delayed clock $\phi_i$ as a local clock carried on a local clock path represented by buffers 130. After propagating through the local clock path, the local clock is again received by selector circuit 125 as a received local clock 135.

Selector circuit 125 is configured to determine a phase error between a reference clock 140 and received local clock 135. In one embodiment, reference clock 140 may comprise a buffered or delayed version of source clock 110. However, reference clock 140 need not be derived from source clock 110 so long as it has the same frequency. Based upon the phase error, selector circuit 125 selects for the selected delayed clock $\phi_i$ so that the phase error is minimized. In other words, selector circuit 125 makes its selection such that received local clock 135 is edge aligned with (or equivalently, in phase with) reference clock 140.

Figure 2:
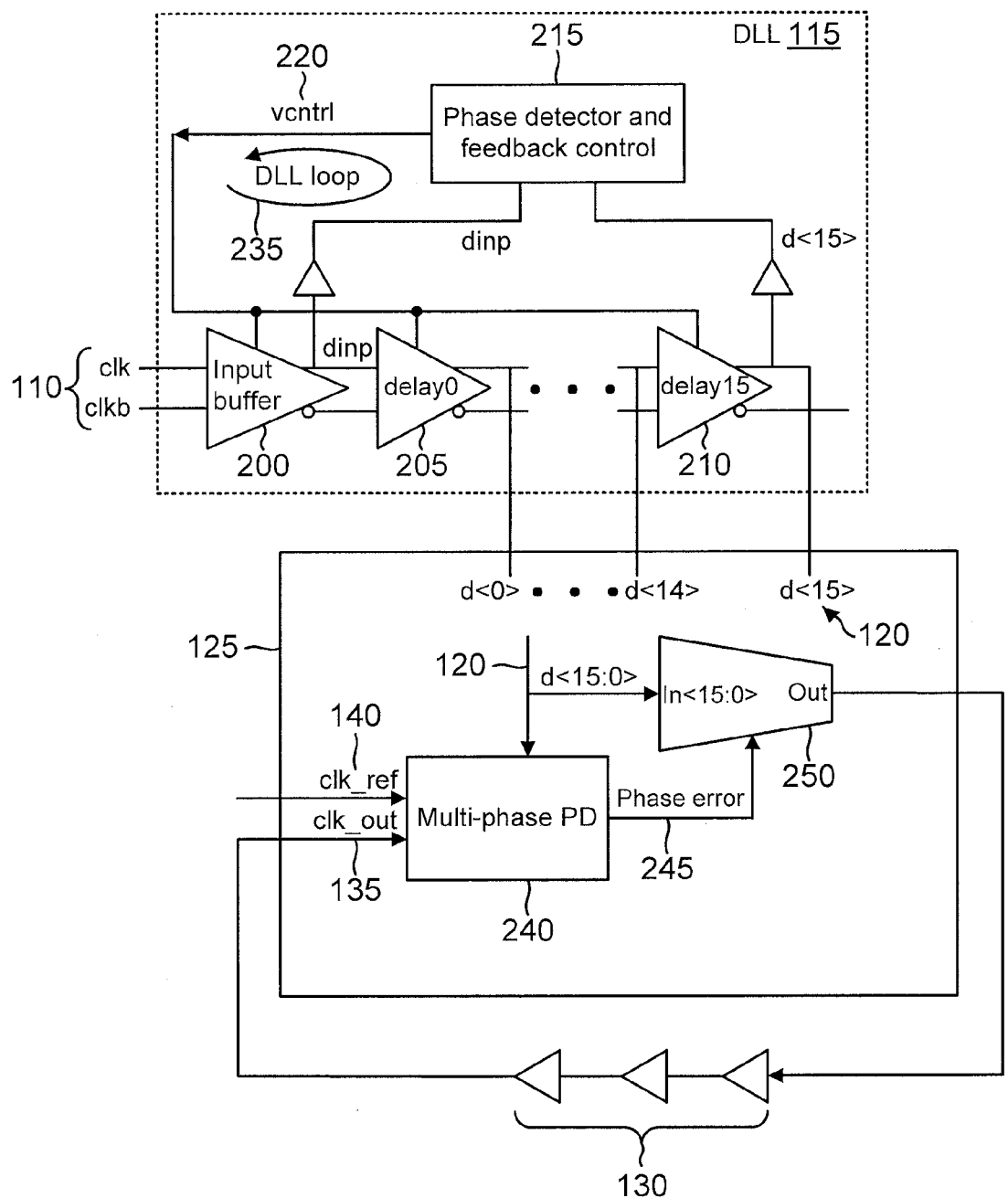
FIG. 2 is a schematic diagram for embodiments of the multi-phase clock generator and selector circuit of FIG. 1.

Example embodiments for multi-phase clock generator 115 and selector circuit 125 are shown in FIG. 2. In one embodiment, multi-phase clock generator 115 comprises a delay-locked loop (DLL) 115 that includes a delay line having a plurality m of delay elements matching the plurality m of delayed clocks that form multi-phase clock 120. It is convenient for the integer m to be a power of two as will be explained further herein. In one embodiment, m may thus equal $2^4$=16 such that the delay elements in DLL 115 range from a zeroth delay element (delay0) 205 to a fifteenth delay element (delay15) 210. A buffering delay element 200 receives source clock 110 and delays source clock into a buffered clock dinp that drives zeroth delay element 205. As shown in FIG. 2, source clock 110 may comprise a differential clock although a single-ended version could also be used.

Figure 3:
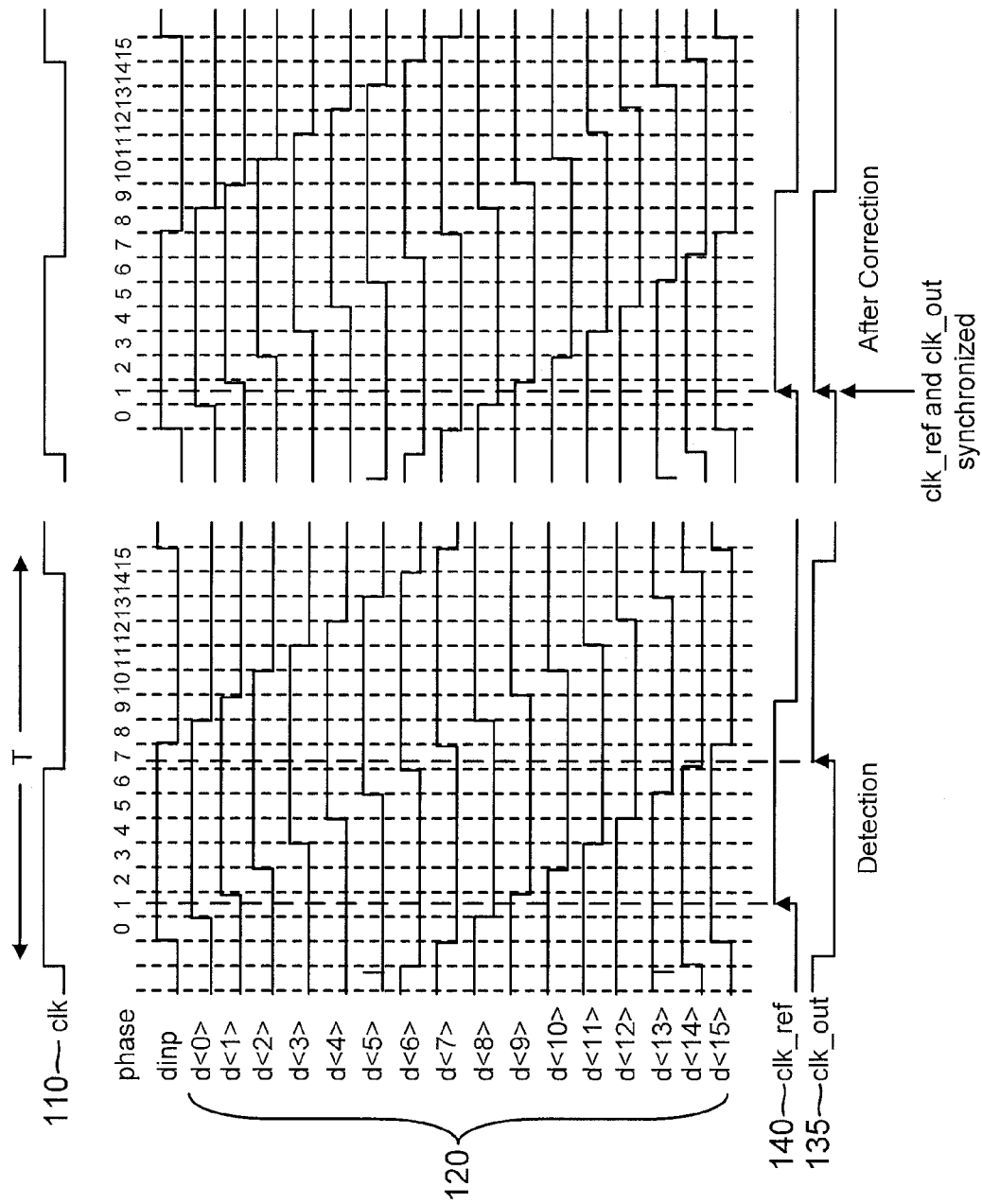
FIG. 3 is a timing diagram for the various clock signals in FIG. 2 before and after phase alignment.

Each delay element produces a corresponding delayed clock as part of multi-phase clock 120, which is represented as d<0:15>. For example, the zeroth delay element 205 produces delayed clock d<0> whereas the fifteenth delay element 210 produces delayed clock d<15>. Similarly, an ith delay element (not illustrated) produces an ith delayed clock d<i>. DLL 115 includes a phase detector and feedback control unit 215 that produces a control voltage (vcntrl) 220. Each delay unit is configured to adjust the amount of delay it applies to its delayed clock responsive to control voltage 220. Phase detector and feedback control unit 215 controls control voltage 220 to implement a feedback loop 235 that keeps delayed clock d<15> phase aligned with buffered input clock dinp. In this fashion, the delayed clocks d<1:15> have a phase relationship to source clock 110 as shown in FIG. 3 in a detection phase prior to the phase correction of received local clock (clk_out) and after its phase correction during a correction phase. The period T of source clock 110 is sampled at 16 equally distributed points such that an ith delayed clock d<i> has a rising edge at ((i)* (T/16))+(T/16) with regard to the rising edge of the buffered input clock dinp. For example, the rising edge of d<0> is delayed by T/16 with regard to the rising edge of buffered input clock dinp. Similarly, the rising edge of d<1> is delayed by 2T/16 with regard to the rising edge of buffered input clock dinp, and so on.

Referring again to FIG. 2, selector circuit 125 includes a multi-phase detector (PD) 240 that compares a received local clock (clk_out) 135 to a reference clock 140 to generate a digital phase error 245. Phase error 245 is a digital code that selects for a selected one of delayed clocks d<0:15> at a multiplexer 250. Multiplexer 250 launches the selected delayed clock (represented by d<i>) as a local clock that propagates through a local clock domain represented by buffers 130 before returning as received local clock 135 to multi-phase detector 240. It will be appreciated that the local clock domain may comprise any suitable collection of logic gates and routes/routings. As discussed with regard to source clock 110, multi-phase clock 120, received local clock 135, and reference clock 140 may all be differential or single-ended clock signals. Similar to multiplexer 250, multi-phase detector 240 also receives delayed clocks d<0:15> so that these delayed clocks may be used to determine a phase for reference clock 140 and to determine a phase for received local clock 135. For example, multi-phase detector 240 may include a flip-flop (not illustrated) for each delayed clock. In an embodiment having 16 delayed clocks d<0:15>, multi-phase detector 240 may thus include 16 flip-flops that may be used in a serial fashion to determine the phase for reference clock 140 and received local clock 135.

Alternatively, multi-phase detector 240 may include thirty-two flip-flops (one set of sixteen for analyzing reference clock 140 and another set of sixteen flip-flops for analyzing received local clock 135). Referring again to a serial embodiment, each flip-flop may be triggered by a clock edge (e.g., a rising clock edge) in the corresponding clock signal being analyzed. For example, suppose reference clock 140 has an incoming phase as shown in FIG. 3 and is used to trigger sixteen flip-flops corresponding to the sixteen delayed clocks d<0:15>. A zeroth flip-flop registers d<0>, a first flip-flop registers d<1>, and so on such that a sixteenth flip-flop registers d<15>.

Given the phasing of the reference clock 140 as shown in FIG. 3, the flip-flop corresponding to d<0> would register a logic high value whereas the flip-flops corresponding to d<1> through d<8> would register a logic low value. Similarly, the flip-flops corresponding to d<9> through d<15> would register a logic high value. The registered values in the flip-flops may thus be used as a digital word by multi-phase detector 240 that represents the phase of reference clock 140. The flip-flops may then be reset (in a serial embodiment) so that the phase of received local clock 135 could be determined analogously such that the flip-flops would then be triggered by the corresponding clock edge in received local clock 135. As a result, multi-phase detector 240 can compare the two resulting digital words (one representing the phase of received local clock 135 and another representing the phase of reference clock 140) to determine digital phase error 245. For example, multi-phase detector 240 could subtract the two digital words to determine the digital phase error 245.

Note that prior to the phase calculations, multiplexer 250 must have launched the local clock or there would be no received local clock 135 to measure. Prior to a phase measurement, phase error 245 could thus have a default value such as all binary zeroes to select for a default delayed clock such as d<0>. With the default delayed clock launched as the local clock from multiplexer 250 during a detection phase of operation, multi-phase detector 240 will thus receive received local clock 135 so that a phase measurement could commence.

In one embodiment, multiplexer 250 may be deemed to comprise a means for selecting from the plurality of delayed clocks responsive to a phase error to form a selected delayed clock and for driving the selected delayed clock into a first end of a clock path. Similarly, multi-phase detector 240 may be deemed to comprise a means for comparing a clock received from a second end of the clock path to a reference clock to determine the phase error.

The phase correction applied by multi-phase detector 240 is relative to the default delayed clock. For example, consider the timing relationship shown in FIG. 3 between reference clock 140 and received local clock 135 during the detection phase of operation. In the example timing relationship shown in FIG. 3, the phase difference between the rising edges of these clocks equals 6*T/16. In other words, the rising edge of the reference clock 140 may be deemed to correspond with the rising edge for delayed clock d<0> as determined in the phase measurement process discussed above. Similarly, the rising edge of the received local clock 135 may be deemed to correspond with the rising edge of delayed clock d<6>. One can thus readily appreciate that such rising edges are separated by six clock displacements in the serial arrangement of d<0> through d<15>. Each successive delayed clock is delayed by T/16 with regard to the preceding delayed clock as discussed above. Accordingly, the delay or skew between reference clock 140 and received local clock 135 shown in FIG. 3 during the detection phase of operation is 6T/16.

Note what this phase difference means: the default delayed clock propagates through local clock domain 130 and becomes delayed by 6T/16 with regard to reference clock 140. If multiplexer 250 could thus launch a delayed clock d<i> that has a rising edge advanced by 6T/16 with regard to the default delayed clock, received local clock 135 will then be phase aligned with reference local clock 140. In this example, the default local clock is d<0> such that the selected delayed clock by multiplexer 250 should be d<[(0-6)modulo 16]>=d<10>. As shown in FIG. 3 after correction with d<10> being launched in this fashion as the local clock, the received local clock 135 is then phase aligned with reference clock 140. More generally, suppose the default clock is d<i> in an embodiment with m default delayed clocks. In addition, suppose that the phase measurement by multi-phase detector 240 indicates that received local clock 135 is delayed by n delay increments with regard to reference local clock 140 (each delay increment equaling T/m). The selected delayed clock in such a case would be d<[(i−n)modulo m]>.

Such a phase alignment is quite advantageous in that phase detector 240 requires just a few clock cycles to make the phase measurements and adjustment. At a clock rate of 1 GHz, that is just a few nanoseconds. In contrast, a conventional use of a PLL to align received local clock 135 with reference clock 140 would require tens of microseconds or longer, which is orders of magnitude slower. In addition, the digital circuitry within multi-phase detector 240 such as the flip-flops discussed earlier is relatively compact and low power. Similarly, multiplexer 250 also requires relatively few transistors to construct. In contrast, a PLL is considerably bulkier and consumes substantially more power.

Figure 4:
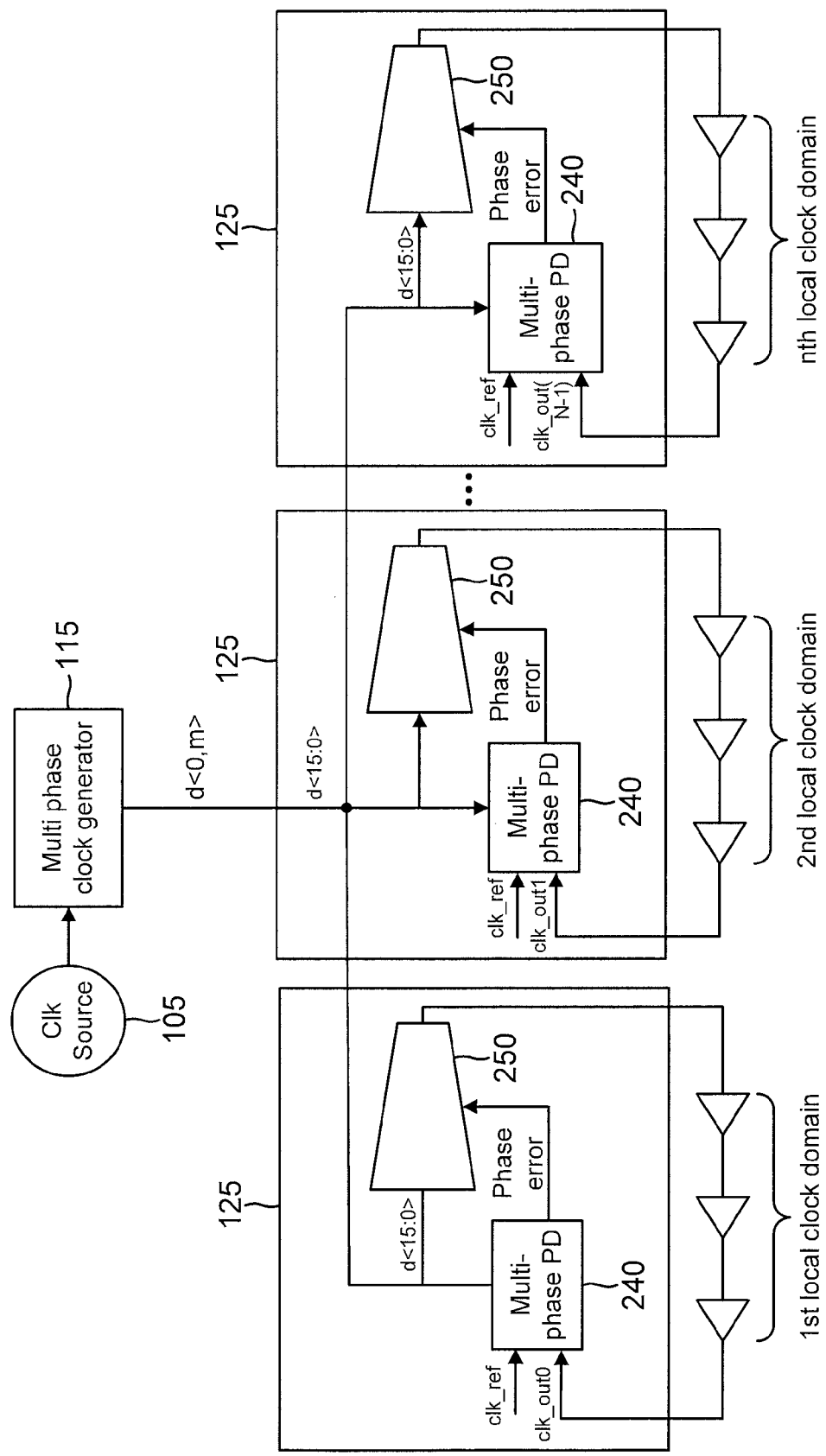
FIG. 4 is a block diagram of an example clock synchronization circuit for synchronizing a plurality of local clocks.

The die area and power savings are further enhanced when a plurality of selector circuits 125 are used to synchronize a corresponding plurality of local clocks as shown in FIG. 4. A single clock source 105 such as a PLL and a multi-phase clock generator 115 such as a DLL provide a common multi-phase clock 120 (d<0,m>) that is distributed to the various selector circuits 125. The integer m represents some arbitrary power of 2 for the number of phases that within multi-phase clock 120. As discussed with regard to FIG. 2, sixteen is an example number of phases but other powers of two may also be used such as eight or thirty-two. Indeed, the number of phases is not limited to only powers of two but such a form is of course convenient in terms of efficient selection at multiplexer 250 by digital phase error 245.

Each selector circuit 125 receives a reference clock that may be independent of the reference clocks received by the remaining selector circuits 125. The multi-phase detector 240 in each selector circuit 125 uses its reference clock to synchronize a received local clock as discussed with regard to FIG. 2. For example, a first selector circuit 125 synchronizes a first received local clock (clk_out0) from a first local clock domain. Similarly, a second selector circuit 125 synchronizes a second received local clock (clk_out1) from a second local clock domain, and so on such that a nth selector circuit 125 synchronizes an nth received local clock (clk_out(N−1)) from an nth local clock domain, wherein n is a plural positive integer representing the number of local clock domains being synchronized.

As discussed with regard to FIG. 2, the components within each selector circuit 125 are relatively compact and low power compared to conventional uses of PLLs. The arrangement shown in FIG. 4 is quite advantageous in that n local clocks may be synchronized with just one PLL. In contrast, a conventional synchronization of n local clocks requires n−1 PLLs. As compared to requiring so many PLLs, selector circuits 125 consume substantially less power and are much denser.

An example method of operation for clock synchronization circuit 100 will now be discussed. Note that this method is defined with regard to a detection period or phase of operation followed by a correction phase of operation. The detection phase occurs prior to the correction phase. In that regard, selector circuit 125 cannot detect the phase of an unsynchronized local clock 135 until multiplexer 250 drives out a default delayed clock. In other words, a clock must be driven out so that a received local clock 135 may be compared to the plurality of delayed clocks 120. As discussed earlier, it is arbitrary what delayed clock forms the default clock but regardless of which one is selected, the subsequent selection by multiplexer 250 responsive to phase error 245 is with regard to the phase of the default clock. For example, suppose d<8> was the default clock. If the received local clock 135 has a rising edge delayed by 3T/16 with regard to the reference clock, one can readily appreciate that advancing the phase of launched local clock by 3T/16 would bring received local clock 135 in phase alignment with the reference clock. In general, such a phase advancement is made with respect to whatever delayed clock is selected as the default clock.

Once the phase error signal is formed, the selector circuit 125 may proceed to the adjustment phase. To prevent glitches, multiplexer 250 may be controlled to gate off its output to the local clock path during the calculation of the phase error 245 from the two captured digital words representing the phases, respectively, of the reference clock 140 and received local clock 135. In that regard, multi-phase detector 240 receives all the delayed clocks 120 and thus knows when their rising edges occur. Multi-phase detector 240 may thus assert phase error 245 prior to the rising edge of what will be the selected delayed clock driven out by multiplexer 250. The synchronized received clock 135 will thus be glitch-free. This is quite advantageous in that the synchronization is relatively instantaneous (taking only a few clock cycles to complete) but may also be free from glitches.

Figure 5:
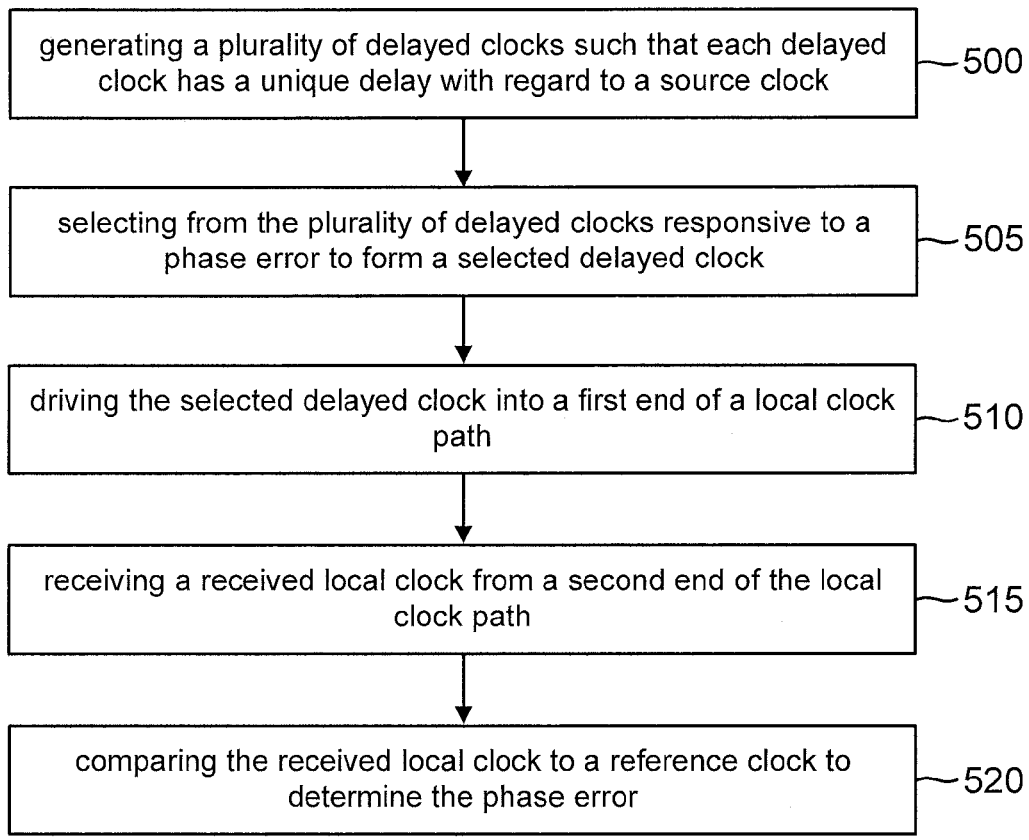
FIG. 5 is a flowchart of an example method of operation for a clock synchronization system.

FIG. 5 is a flowchart summarizing such a method of operation. A step 500 comprises generating a plurality of delayed clocks such that each delayed clock has a unique delay with regard to a source clock. Such an act is discussed above with regard to the operation of DLL 115. The method also includes an act 505 of selecting from the plurality of delayed clocks responsive to a phase error to form a selected delayed clock. Since this selection is responsive to the phase error, it is representative of the selection that occurs in multiplexer 250 during the correction phase of operation. In contrast, multiplexer 250 outputs a default delayed clock during the determination phase as discussed earlier. The default delayed clock is not selected responsive to a phase error—indeed, it is generated prior to the determination of the phase error.

The method also includes an act 510 of driving the selected delayed clock into a first end of a local clock path. In the example embodiment shown in FIG. 2, the first end of the local clock path is the output of multiplexer 250. In addition, the method includes an act 515 of receiving a received local clock from a second end of the local clock path. The receipt of received local clock 135 at multi-phase detector 240 is one example of act 515. Finally, the method includes an act 520 of comparing the received local clock to a reference clock to determine the phase error. Such an act occurs during the determination phase as discussed above with regard to the determination of phase error 245.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A clock synchronization circuit, comprising:
a multi-phase clock generator configured to generate a plurality of delayed clocks from a source clock, each delayed clock having a unique delay with regard to the source clock; and
a selector circuit configured to select one of the delayed clocks based upon a phase error, the selector circuit being further configured to launch the selected one of the delayed clocks through a clock path so as to receive a local clock from the clock path, the selector circuit being further configured to compare the received local clock from the local clock path to a reference clock to determine the phase error, and wherein the selector circuit includes a multi-phase detector configured to compare the received local clock to the plurality of delayed clocks to determine a first digital word and to compare the reference clock to the plurality of delayed clocks to determine a second digital word, and wherein the multi-phase detector is further configured to compare the first and second digital words to determine the phase error.

2. The clock synchronization circuit of claim 1, wherein the selector circuit includes a multiplexer for selecting the selected one of the delayed clocks responsive to the phase error.

3. The clock synchronization circuit of claim 1, wherein the selector circuit is further configured to launch the selected one of the delayed clocks into a first end of the clock path and to receive the received local clock from an opposing second end of the clock path.

4. The clock synchronization circuit of claim 1, wherein the multi-phase clock generator comprises a delay-locked loop (DLL).

5. The clock synchronization circuit of claim 4, wherein the DLL includes a delay line having a plurality of delay elements arranged in a series.

6. The clock synchronization circuit of claim 5, wherein the plurality of delay elements corresponds to the plurality of delayed clocks, and wherein each delay element is configured to produce the corresponding delayed clock.

7. The clock synchronization circuit of claim 6, further comprising a clock source for producing the source clock.

8. The clock synchronization of claim 6, wherein the clock source comprises a phase-locked loop (PLL).

9. The clock synchronization circuit of claim 5, wherein each delay circuit is configured to be responsive to a control voltage, and wherein the DLL includes a phase detector and control circuit configured to generate the control voltage such that a delayed clock from a final delay element in the series is phase-aligned with a delayed clock from an initial delay element in the series.

10. The clock synchronization circuit of claim 1, wherein the selector circuit comprises a plurality of selector circuits for synchronizing a corresponding plurality of received local clocks.

11. A method, comprising:
generating a plurality of delayed clocks such that each delayed clock has a unique delay with regard to a source clock;
selecting from the plurality of delayed clocks responsive to a phase error to form a selected delayed clock;
driving the selected delayed clock into a first end of a local clock path;
receiving a local clock from a second end of the local clock path;
comparing the received local clock to the plurality of delayed clocks to determine a first digital word;
comparing the reference clock to the plurality of delayed clocks to determine a second digital word; and
comparing the first digital word to the second digital word to determine the phase error.

12. The method of claim 11, wherein generating the plurality of delayed clocks comprises serially delaying the source clock such that each serial delay of the source clock forms a corresponding one of the delayed clocks.

13. The method of claim 12, wherein the plurality of delayed clocks comprises a positive integer m of delayed clocks, and wherein serially delaying the source clock comprises serially delaying the source clock over m stages by a delay of 1/mth of a period for the source clock for each stage.

14. The method of claim 11, further comprising delaying the source clock to form the reference clock.

15. The method of claim 11, further comprising:
prior to selecting from the delayed clocks to form the selected delayed clock, driving a default one of the delayed clocks into the first end of the local clock path.

16. A system, comprising:
a multi-phase clock generator configured to generate a plurality of delayed clocks, each delayed clock being delayed by a unique delay with regard to a source clock;
means for selecting from the plurality of delayed clocks responsive to a phase error to form a selected delayed clock and for driving the selected delayed clock into a first end of a clock path; and
a multi-phase detector configured to compare the received local clock to the plurality of delayed clocks to determine a first digital word and to compare the reference clock to the plurality of delayed clocks to determine a second digital word, and wherein the multi-phase detector is further configured to compare the first and second digital words to determine the phase error.

17. The system of claim 16, wherein the multi-phase clock generator comprises a delay-locked loop (DLL).

18. The system of claim 17, wherein the DLL includes a delay line having a plurality of delay elements arranged in a series.

19. The system of claim 18, wherein the plurality of delay elements corresponds to the plurality of delayed clocks, and wherein each delay element is configured to produce the corresponding delayed clock.

20. The system of claim 16, further comprising a clock source for producing the source clock.

21. The system of claim 20, wherein the clock source comprises a phase-locked loop (PLL).

* * * * *